(12) United States Patent
Van Leeuwen et al.

(10) Patent No.: US 11,585,878 B2
(45) Date of Patent: Feb. 21, 2023

(54) MRI SYSTEMS AND RF TRANSMIT ANTENNA ARRANGEMENT INCLUDING A COAXIAL CABLE WITH AN ELECTRICALLY CONDUCTIVE CORE AND AN ELECTRICALLY CONDUCTIVE OUTER SHIELD

(71) Applicants: Tesla Dynamic Coils BV, Zaltbommel (NL); Futura Composites B.V., Heerhugowaard (NL); UMC Utrecht Holding B.V., Utrecht (NL)

(72) Inventors: Carel Costijn Van Leeuwen, Utrecht (NL); Alexander Jan Eberhard Raaijmakers, Utrecht (NL); Bart Romke Steensma, Utrecht (NL); Martino Borgo, Heerhugowaard (NL); Catalina Sofia Arteaga De Castro, Zaltbommel (NL); Cornelius Antonius Theodorus Van Den Berg, Utrecht (NL); Dennis Wilhelmus Johannes Klomp, Utrecht (NL)

(73) Assignees: TESLA DYNAMIC COILS BV, Zaltbommel (NL); FUTURA COMPOSITES B.V., Heerhugowaard (NL); UMC UTRECHT HOLDING B.V., Utrecht (NL)

( * ) Notice: Subject to any disclaimer, the term of this patent is extended or adjusted under 35 U.S.C. 154(b) by 0 days.

(21) Appl. No.: 17/369,610

(22) Filed: Jul. 7, 2021

(65) Prior Publication Data
US 2022/0268863 A1 Aug. 25, 2022

(30) Foreign Application Priority Data
Feb. 25, 2021 (GB) .................................... 2102685

(51) Int. Cl.
*G01R 33/34* (2006.01)
*G01R 33/36* (2006.01)

(52) U.S. Cl.
CPC ... *G01R 33/34007* (2013.01); *G01R 33/3607* (2013.01); *G01R 33/3628* (2013.01)

(58) Field of Classification Search
CPC .......... G01R 33/34007; G01R 33/3607; G01R 33/3628
See application file for complete search history.

(56) References Cited

U.S. PATENT DOCUMENTS 4,816,766 A * 3/1989 Zabel .................. G01R 33/341
324/318
4,839,594 A 6/1989 Misic et al.
(Continued)

FOREIGN PATENT DOCUMENTS

DE 202007015620 U1 2/2008

OTHER PUBLICATIONS

UKIPO Search Report dated Nov. 19, 2021 for corresponding UK Application No. GB2102685.1.
(Continued)

*Primary Examiner* — G. M. A Hyder
(74) *Attorney, Agent, or Firm* — McCormick, Paulding & Huber PLLC

(57) ABSTRACT

An MRI system RF transmit antenna arrangement 3 including an antenna 5 including a length of coaxial cable 51 with an electrically conductive core 52 and an electrically conductive outer shield 53 through which the core runs, with the core having a feed point 52a arranged for electrical connection to an RF source and at least one break 53a being provided in the electrically conductive outer shield partway along the length of coaxial cable so as to divide the electrically conductive outer shield 53 into at least two axially (Continued)

spaced shield portions such that at least one of the shield portions acts as a radiating element when an RF source is connected to the feed point 52*a*.

29 Claims, 4 Drawing Sheets

(56) References Cited

U.S. PATENT DOCUMENTS

| | | |
|---|---|---|
| 9,678,180 B2 | 6/2017 | Yang et al. |
| 2014/0197832 A1 | 7/2014 | Driesel et al. |
| 2018/0329005 A1 | 11/2018 | Sodickson et al. |

OTHER PUBLICATIONS

EPO Search Report dated Nov. 9, 2021 for corresponding EP Application No. EP21174038.

Mohammadzadeh et al.; "High SNR flexible top hat monopole probe for 1.5 T MRI"; Measurement Science and Technology; Jun. 21, 2006; vol. 17; Institute of Physics Publishing; United Kingdom.

K. Solbach et al.; "Compensation of electric cross-field response in shielded loop probe"; Electronics Letters; Jan. 20, 2011; vol. 47 No. 2; The Institution of Engineering and Technology; United Kingdom.

Lena Nohava et al.; "Flexible Multi-Turn Multi-Gap Coaxial RF Coils: Design Concept and Implementation for Magnetic Resonance Imaging at 3 and 7 Tesla"; IEEE Transactions on Medical Imaging; Apr. 1, 2021; Institute of Electrical and Electronics; United States.

S. Corradini et al.; "MR-guidance in clinical reality: current treatment challenges and future perspectives"; Radiation Oncology; pp. 1-12; vol. 14; Jun. 3, 2019 by Radiation Oncology; BMC; United Kingdom.

\* cited by examiner

MRI SYSTEMS AND RF TRANSMIT ANTENNA ARRANGEMENT INCLUDING A COAXIAL CABLE WITH AN ELECTRICALLY CONDUCTIVE CORE AND AN ELECTRICALLY CONDUCTIVE OUTER SHIELD

CROSS-REFERENCE TO RELATED APPLICATION

This application claims foreign priority benefits under 35 U.S.C. § 119 to British Patent Application No. 2102685.1 filed on Feb. 25, 2021, the content of which is hereby incorporated by reference in its entirety.

TECHNICAL FIELD

This invention relates to MRI systems (including MRSI systems) which include RF transmit antenna arrangements and to RF transmit antenna arrangements for use in MRI systems (including MRSI systems) as well as in some embodiments, combined systems such as MR-Linac and PET-MR systems where there is an MRI system used in combination with another system.

BACKGROUND

An MRI system typically comprises a main MRI scanner arrangement, a patient support or bed on which a patient lies during scanning and in at least some cases a separate, local, RF (Radio Frequency) arrangement (or body part specific RF arrangement) which is arranged for location in the region of a particular body part which it is desired to scan.

The main MRI scanner arrangement typically comprises a main magnet, gradient coils, RF transmit antennas/coils, and receive coils all arranged in a main unit with a bore in which the patient is positioned during scanning. Where present, a body part specific RF arrangement will typically also be positioned in the bore during scanning. A body part specific RF arrangement may comprise at least one receive coil and/or at least one RF transmit antenna/coil.

As is well known MRI (magnetic resonance imaging) systems are widely used for imaging subjects and can also be used in combination systems such as MR-Linac, PET-MR systems, and MRI thermal therapies such as MRI-guided laser interstitial thermal therapy. These combine magnetic resonance imaging with other techniques for treatment, say in MR-Linac, and MRI thermal therapies or to provide functional imaging say in PET-MR. A further subset of MRI systems, are MRSI (magnetic resonance spectroscopy imaging) systems in which spatially localised spectra may be obtained from within sample or patient.

In MRI operation, the magnet creates a large static magnetic field $B_0$, the RF transmit antennas/coils generate an alternating magnetic field $B_1$ and the receive coils, whether provided in the main unit or in a body part specific receive coil are arranged for collecting a magnetic resonance signal (that is to say acquiring magnetic resonance data). The gradient coils are used to allow spatial encoding on the $B_0$ field to enable tomographic imaging.

When an MRI system is operated using the receive coils provided in the main unit of the scanning apparatus, the resolution and accuracy of the results can be limited in some cases. This leads to the use of separate, one may say local, receive coils, say body part specific coils as mentioned above which aim to improve imaging of a selected location/body part. In at least some cases it may be beneficial to be able to provide RF transmit antenna/coils in a local or body part specific RF arrangement along with local receive coils or independently therefrom.

Providing local RF transmit antennas/coils can be problematic in at least some cases since conventional RF transmit antennas/coils can be ill-suited to inclusion in a body part specific RF arrangement which is arranged to closely conform to the shape of a particular body part.

A further issue to consider is the SAR (specific absorption rate) (heating effect) which is seen in a subject being imaged due to the signals being applied to the subject to produce the desired $B_1$ field. Typically the heating effect is caused by electric fields which are generated in the subject as a by-product of creating the desired $B_1$ field. In general it is desirable to minimise the SAR levels produced for any given strength of $B_1$ field.

SUMMARY

Thus, it would be desirable to provide MRI system RF transmit antenna arrangements which are aimed at addressing at least one of these issues as well as MRI systems and combined therapy and/or imaging systems which include such an MRI system RF transmit antenna arrangement.

According to a first aspect of the invention there is provided an MRI system RF transmit antenna arrangement comprising an antenna comprising a length of coaxial cable with an electrically conductive core and an electrically conductive outer shield through which the core runs, with the core having a feed point arranged for electrical connection to an RF source and at least one break being provided in the electrically conductive outer shield partway along the length of coaxial cable so as to divide the electrically conductive outer shield into at least two axially spaced shield portions such that at least one of the shield portions acts as a radiating element when an RF source is connected to the feed point.

Such arrangements facilitate providing antennas which are both effective and flexible so that they can be more easily shaped as desired. This for example allows the inclusion of such an antenna in an arrangement which is shaped to conform more closely to a subject or a part of a subject to be investigated. Moreover such arrangements facilitate the provision of antennas which minimise the observed SAR levels for a given magnitude of $B_1$ field produced in a subject. This in turn can be considered to be a result of a minimisation of the electric field generated in a subject for a given magnitude of $B_1$ field produced in a subject.

The antenna may be arranged as a monopole antenna with the feed point provided in the region of one end of the length of coaxial cable.

Preferably the antenna is arranged as a dipole antenna with the feed point provided towards a midpoint of the length of coaxial cable so that the length of coaxial cable has a first coaxial cable portion on one side of the feed point and a second coaxial cable portion on a second, opposite, side of the feed point.

The shield in the first coaxial cable portion may be electrically, typically galvanically, connected to the shield in the second coaxial cable portion. The core in the first coaxial cable portion and the core in the second coaxial cable portion may be arranged for the source to be connected therebetween at the feed point.

In one set of embodiments, where the antenna is arranged as a dipole antenna, at least one break is provided in the electrically conductive outer shield partway along the length of the first coaxial cable portion and at least one break is provided in the electrically conductive outer shield partway along the length of the second coaxial cable portion so as to divide the electrically conductive outer shield of the length of coaxial cable into at least three axially spaced shield portions such that at least one of the shield portions acts as a radiating element when an RF source is connected to the feed point.

This can provide a particularly simple and effective antenna. Typically the mid portion of the electrically conductive outer shield will act as radiating element in such an arrangement. This mid portion being made up of a portion of the outer shield of the first coaxial cable portion and a portion of the outer shield of the second coaxial cable portion and having ends defined by respective breaks in the outer shield. The length of this mid portion will tend to define a field of view for the subject area to be scanned in use. Thus in some cases the length of this mid portion may be selected in dependence on a desired field of view.

In alternatives the antenna may comprise more than two coaxial cable portions leading away from the feed point. In such a case at least one break may be provided in the electrically conductive outer shield partway along the length of each coaxial cable portion.

In some instances a multi-pole antenna may be provided.

In general the or each radiating element of the antenna arrangement may be provided by at least one shield portion of a coaxial cable portion, where said at least one shield portion is spaced by an axial break in the conductive outer shield of the coaxial cable portion from another shield portion of the coaxial cable portion.

The antenna arrangement may comprise at least one electrical component connected to at least one of the electrically conductive outer shield and the electrically conductive core of the length of coaxial cable for controlling the electrical characteristics of the antenna arrangement.

The at least one electrical component may comprise at least one of: an inductor, a resistor, a capacitor.

The at least one electrical component may be selected to tune the antenna arrangement for operation whilst driven at predetermined RF source frequency.

The at least one electrical component may be selected to make the antenna arrangement tuned or tuneable for operation whilst driven at a predetermined plurality of RF source frequencies and/or within a predetermined range of RF source frequencies.

The at least one electrical component may comprise an at least one connecting electrical component electrically connected between the electrically conductive outer shield and the electrically conductive core of the or each coaxial cable portion towards an end which is away from the feed point. The at least one electrical component may be provided in a matching circuit provided at the feed point via which the electrical source is connectable to the antenna arrangement.

At least one connecting electrical component may be electrically connected between the electrically conductive outer shield and the electrically conductive core of the or each coaxial cable portion towards an end which is away from the feed point.

The at least one connecting electrical component may comprise at least one of: an inductor, a resistor, a capacitor.

In a preferred set of embodiments, the at least one connecting electrical component comprises an inductor.

The provision of at least one connecting electrical component at such a location (or at such locations) can help reduce losses by helping to control the relative levels of current that flow in the electrically conductive outer shield and the electrically conductive core.

The at least one connecting electrical component may be selected to tune the antenna arrangement for operation whilst driven at a predetermined RF source frequency.

The at least one connecting electrical component may be selected to make the antenna arrangement tuned or tuneable for operation whilst driven at a predetermined plurality of RF source frequencies and/or within a predetermined range of RF source frequencies.

The at least one connecting electrical component may comprise at least one inductor and at least one capacitor arranged in an LC resonant circuit. The at least one connecting electrical component may comprise at least one switch for selecting a tuned frequency for the antenna arrangement from within a predetermined plurality of RF source frequencies or from within a predetermined range of RF source frequencies.

In alternatives, there may be an open circuit between the electrically conductive outer shield and the electrically conductive core of the or each coaxial cable portion towards an end which is away from the feed point.

In other alternatives, there may be a short circuit between the electrically conductive outer shield and the electrically conductive core of the or each coaxial cable portion towards an end which is away from the feed point.

The antenna arrangement may comprise a matching circuit provided at the feed point via which the electrical source is connectable to the antenna arrangement.

The matching circuit may comprise at least one matching electrical component. The matching circuit may comprise at least one of: an inductor, a resistor, a capacitor.

In a preferred embodiment the matching circuit comprises as capacitor.

In a currently most preferred embodiment, the connecting electrical component comprises an inductor and the matching circuit comprises a capacitor. Even more preferably the at least one connecting electrical component comprises a respective single inductor and the matching circuit comprises as a single capacitor.

This can lead to an efficient design where losses in the coaxial cable portions are minimised and losses in the at least one electrical component and the matching circuit are minimised.

The at least one length of coaxial cable may have a length in the range 10 cm to 100 cm, preferably in the range 20 cm to 60 cm. One length that works well is 30 cm.

The radiating element may have a length in the range 8 cm to 50 cm or even 8 cm to 75 cm, but preferably in the range 10 cm to 30 cm.

The ratio of the length of the radiating element to the overall length of the coaxial cable may be in the range 0.2:1 to 0.9:1. Thus at these extremes the radiating element would be ⅕ the length of the cable and 9/10 the length of the cable. Preferably the ratio of the length of the radiating element to the length of the coaxial cable is in the range 0.4:1 to 0.8:1. A ratio that works well is in the order of 2:3—so the radiating element is ⅔ the overall length of the cable.

In general terms it has been found that increasing the spacing between the breaks in the shield in a dipole antenna as defined above promotes a flatter current distribution on the radiating element, but as a flip side it can tend to increase current flowing, in at least some cases in a standing wave on the inner conductor. The provision of connecting electrical components, as mentioned above can help to control this.

The distance between the feed point and the break in the outer conductive shield of the respective coaxial cable portion may be selected in combination with the frequency at which the antenna is to be driven such that said distance is no longer than ¾ of a wavelength as manifested on the radiating element.

According to another aspect of the invention there is provided a method of manufacturing an MRI system RF transmit antenna arrangement as defined above which comprises a dipole antenna having two coaxial cable portions each provided with a respective break in the outer shield partway along the length of the respective coaxial cable portion, the method comprising the steps of:
a) selecting a desired length, L, for the radiating element of the antenna, which corresponds to a distance between the respective breaks in the outer shield;
b) modelling the antenna including the two coaxial cable portions each with a break in the outer shield at distance L/2 from the feed point and end portions of coaxial cable of length X beyond the respective break, a source connected to the feed point, at least one first connecting electrical component provided towards a distal end of a first of the coaxial cable portions and at least one second connecting electrical component provided towards a distal end of a second of the coaxial cable portions;
c) determining a value for length X and characteristics of the at least one first and second connecting electrical components which optimise: flatness of current distribution on the radiating element;
ii) loss minimisation in the inner core and connecting components; and
iii) a desirable input impedance at the source; and
d) making the transmit antenna arrangement to said design.

The at least one first connecting electrical component may comprise, or consist of, an inductor. The at least one second connecting electrical component may comprise, or consist of, an inductor.

The step of determining a value for length X and characteristics of the at least one first and second connecting electrical components may comprise, or consist of, determining a value for length X and a value of inductance for each inductor.

According to another aspect of the invention there is provided a method of manufacturing an MRI system RF transmit antenna arrangement as defined above which comprises a dipole antenna having two coaxial cable portions each provided with a respective break in the outer shield partway along the length of the respective coaxial cable portion, the method comprising the steps of:
a) selecting a desired length, L, for the radiating element of the antenna, which corresponds to a distance between the respective breaks in the outer shield;
b) modelling the antenna including the two coaxial cable portions each with a break in the outer shield at distance L/2 from the feed point and end portions of coaxial cable of length X beyond the respective break, a source connected to the feed point, a first inductor as a connecting electrical component provided towards a distal end of a first of the coaxial cable portions and a second inductor as a connecting electrical component provided towards a distal end of a second of the coaxial cable portions;
c) determining a value for length X and a value of inductance for each inductor which optimises:
i) flatness of current distribution on the radiating element;
ii) loss minimisation in the inner core and connecting components; and
iii) a desirable input impedance at the source; and
d) making the transmit antenna arrangement to said design.

Flatness of current distribution may be measured as the coefficient of variation in current along the radiating element—calculated as the standard deviation divided by the mean of current amplitude along the radiating element.

As an example with a typical length L (say in the order of 20 cm), then an aim for the coefficient of variation in current along the radiating element might be to be less than 0.2, preferably less than 0.15 and even more preferably less than 0.10.

Losses may be measured as the percentage of input power which is wasted. Preferably the percentage of input power wasted is less than 20%, more preferably no greater than 10%, more preferably still no greater than 5%.

A desirable input impedance is one that is easy to match the source to, and optionally, one that minimises losses in any matching circuit. The real part of the impedance is important in trying to achieve optimal operation. Preferably the real part of the input impedance is at least 5 Ohms, more preferably at least 10 Ohms. Preferably the real part of the input impedance is not greater than 150% of the impedance of the source. Ideally the real part of the input impedance is at least 10 Ohms and such that a single electrical component is sufficient in the matching circuit.

The method may comprise selecting an operating frequency or a range of operating frequencies at which the antenna is to be driven in use and carrying out at least one of steps a), b), and c) whilst taking the selected operating frequency or a range of operating frequencies into account.

The antenna arrangement may comprise an array of antennas, each comprising a respective length of coaxial cable as defined above. For example the antenna arrangement may comprise eight antennas.

The antenna arrangement may comprise a support structure for supporting the at least one length of coaxial cable.

The antenna arrangement may be arranged as a body part specific antenna arrangement and comprise a support structure for supporting the at least one length of coaxial cable in a configuration which is selected for scanning the respective body part.

The antenna arrangement may comprise at least one RF receive coil.

The support structure may be arranged for supporting the at least one RF receive coil.

The body part specific antenna arrangement may comprise at least one RF receive coil supported on the support structure in a configuration which is selected for scanning the respective body part. The at least one RF receive coil may comprise a respective length of coaxial cable arranged in a loop.

According to another aspect of the invention there is provided an MRI system RF transmit antenna apparatus comprising an MRI system RF transmit antenna arrangement as defined above and an RF source connected to the feed point.

The antenna arrangement may be tuned for operation at a predetermined RF source frequency and the RF source may be arranged for driving the antenna arrangement at said predetermined frequency.

The antenna arrangement may be tuned or tuneable for operation at a predetermined plurality of RF source frequencies and/or within a predetermined range of RF source frequencies and the RF source may be arranged for driving the antenna arrangement at said predetermined plurality of RF source frequencies and/or within the predetermined range of RF source frequencies.

According to another aspect of the invention there is provided an MRI system comprising an MRI system RF transmit antenna arrangement as defined above.

According to another aspect of the invention there is provided an MRI system comprising a main MRI scanner arrangement, a patient support, and an MRI system comprising an MRI system RF transmit antenna arrangement as defined above which is electrically connected to the main MRI scanner arrangement.

According to another aspect of the invention there is provided an MR-Linac system comprising an MRI system as defined above and a medical linear accelerator system.

According to another aspect of the invention there is provided a PET—MR system comprising an MRI system as defined above and a positron emission tomography system.

According to another aspect of the invention there is provided a thermal therapy—MR system comprising an MRI system as defined above and a thermal therapy system.

Note that, in general terms and with any necessary modifications in wording, all of the further features defined above following any aspect of the invention above are applicable as further features of all other aspects of the invention defined above. These further features are not restated after each aspect of the invention merely for the sake of brevity.

BRIEF DESCRIPTION OF THE DRAWINGS

Embodiments of the present invention will now be described, by way of example only, with reference to the accompanying drawings in which.

DETAILED DESCRIPTION

Figure 1:
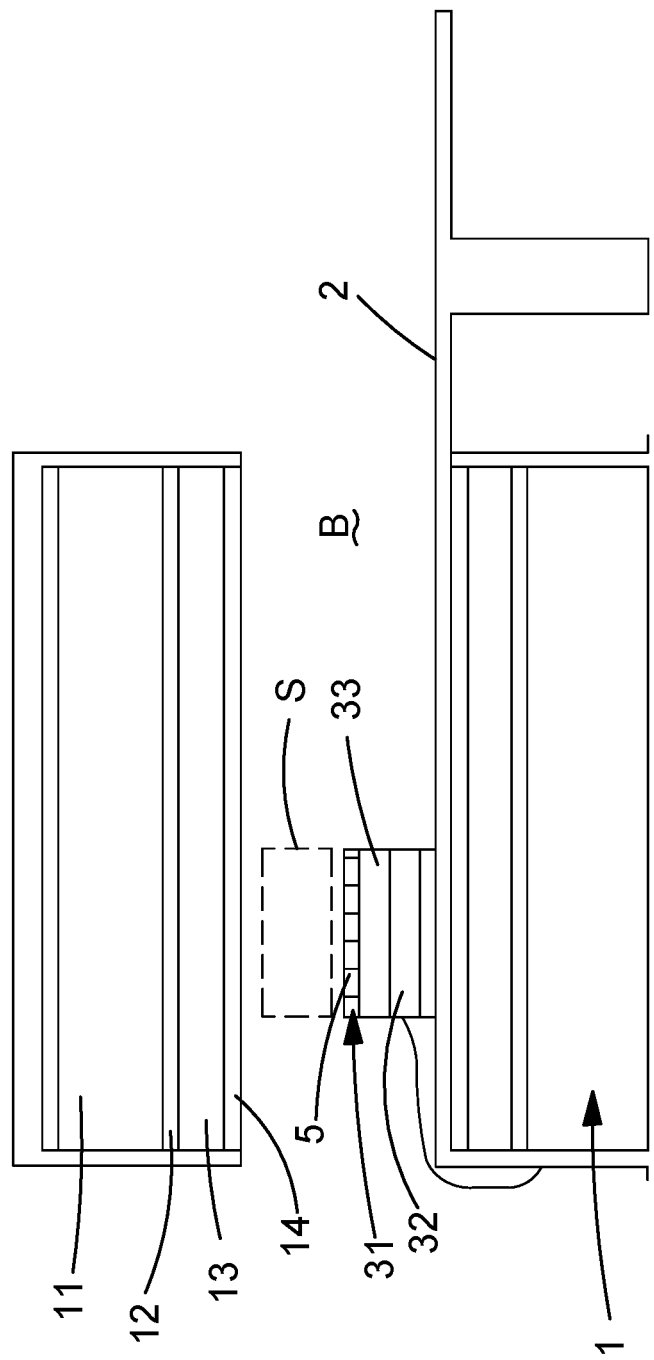
FIG. 1 schematically shows an MRI system including a RF transmit antenna arrangement.

FIG. 1 shows an MRI system comprising a main scanner arrangement 1, a patient support 2 which is arranged for supporting a patient when in the scanner arrangement 1 and an MRI system RF transmit antenna arrangement 3 including an array 31 of RF transmit antennas 5 which is separate from the main scanner arrangement and which in this embodiment is a body part specific RF transmit antenna arrangement 3. The present kind of RF transmit antenna 5 might be used alone, but more usually the antennas 5 will be provided in an array 31 as in the present embodiment. As an example eight antennas 5 might be provided in an array 31. More detail of each RF transmit antenna 5 will be described further below. At its simplest an RF transmit antenna arrangement 3 may comprise just an antenna 5. In the present embodiment however, the RF transmit antenna arrangement 3 has other component parts as well.

In this embodiment the body part specific RF transmit antenna arrangement 3 also comprises local receive coils 32 and may be considered a body part specific RF arrangement 3. More generally such a RF transmit antenna arrangement 3 (or RF arrangement) may be termed a local RF transmit antenna arrangement (or local RF arrangement).

As alluded to above, in some instances an MRI system will be used in combination with other systems so as to provide for example, an MR-Linac system which comprises an MRI system and a medical linear accelerator system; or in another example, so as to provide a PET-MR system comprising an MRI system and a positron emission tomography system; or in another example, so as to provide a thermal therapy-MR system comprising an MRI system and a thermal therapy system. In such a case, the MRI system shown in FIG. 1 may be supplemented by a linear accelerator system, a positron emission tomography system, or a thermal therapy system S illustrated in dotted lines only in highly schematic form in FIG. 1.

The main MRI scanner arrangement 1 may be an entirely conventional main MRI scanner arrangement comprising a main magnet 11 which will typically be a superconducting electromagnet, main unit RF transmit coils 12, gradient coils 13 and main unit receive coils 14. These components are provided in a main body of the MRI scanner arrangement 1 which has a main bore B in which the patient support 2 is provided or, more typically, into which the patient support 2 can be moved carrying a patient until an operative position is reached.

At least in use, the body part specific RF arrangement 3 is also provided in this main bore B. Where present at least part of a medical linear accelerator system, positron emission tomography system, or thermal therapy system S may also be located in this main bore B during operation.

As well as being located in the main bore B of the main MRI scanner 1 during operation, the RF arrangement 3 is electrically connected to the main scanner arrangement 1 such that the magnetic resonance signals picked up by the receive coils 32 may be fed into the main scanner arrangement 1 for processing. RF drive signals may also be provided to the RF arrangement 3 from the main MRI scanner 1 for driving the antennas 5 during operation, or the RF drive signals may be provided from a separate signal source (not shown).

The signals picked up by the receive coils 32 may be used alone or in combination with signals picked up by the main unit receive coils 14 in processing and generating images. In some instances a main MRI scanner arrangement 1 without its own main unit receive coils 14 could be used with the present type of RF arrangement 3.

More particularly, in alternatives at least one antenna 5 of the present kind, and more typically an array of antennas 5 of the present kind may be provided in a local RF arrangement 3 and used with an MRI system main scanner without any of its own main unit RF transmit coils 12. In other alternatives at least one antenna 5 of the present kind may be provided to act as the main RF transmit coils 12 in an MRI system main scanner arrangement. Such an alternative arrangement may then have no local RF arrangement 3, if desired.

The structure and operation of MRI scanner arrangements is well developed and understood and the present ideas in the present embodiment relate to RF arrangement 3 for use with such an MRI scanner arrangement and more particularly relate to the structure and operation of the antennas 5 of the present kind. Therefore, further description of the structure and operation of the MRI scanner arrangement 1 is not necessary and the remainder of this description relates to the RF arrangement 3 and in particular to the or each antenna 5.

The RF arrangement 3 comprises a support structure 33 which supports the array of antennas 5 and also the local receive coils 32 and is suitably shaped for arrangement around a portion of a subject which is to be scanned. At least some of the receive coils 32 may be flexible in nature allowing these to shaped around the area of interest in the subject to be scanned. These receive coils 32 may include, in some cases, receive coils made of loops of coaxial cable.

Each of the antennas 5 in the present embodiment is of a flexible nature and is arranged so that provided on the support structure 33 it may be arranged in a shape design to conform with a part of a subject which is to be scanned.

In other cases, each antenna 5 may not be shaped so as to conform with a particular part of a subject to be scanned but still provided in the RF arrangement 3 in close proximity to the region to be scanned. Having the or each antenna 5 in the region of the portion of the subject to be scanned and/or closely conformed to the shape of the portion of the subject to be scanned can help reduce the amount of power needed to generate the desired $B_1$ field in a region of interest in the subject.

Figure 2:
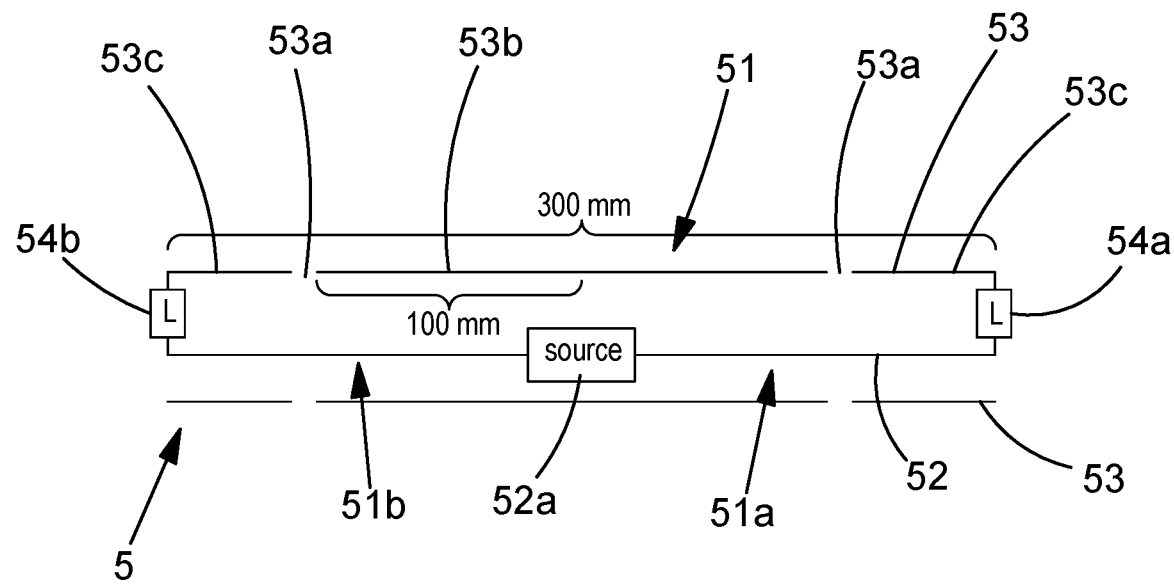
FIG. 2 schematically shows a cross-section of an antenna of the RF transmit antenna arrangement of the MRI system shown in FIG. 1, taken along the length of the antenna.

FIG. 2 shows a schematic cross-section of one of the antennas 5 included in the array 31 in the present embodiment. The antenna 5 comprises a length of coaxial cable 51 which, in the present embodiment, has an overall length of 300 mm. The length of the coaxial cable 51 comprises an electrically conductive core 52 and surrounding this an electrically conductive shield 53. The length of coaxial cable itself can be just a length of standard say 50 Ohm or 75 Ohm coaxial cable—such a cable will typically have an outer insulating casing over the shield 53 and inner insulating spacer between the core 52 and the shield 53—typically these may be of a plastics material.

A feed point 52a to which the RF driving source can be connected is provided on the core 52. In the present embodiment the feed point 52a is provided towards a mid-point of the core 52 and the antenna 5 is arranged as a dipole antenna.

If a source is connected to a feed point on the middle of a core of a length of coaxial cable and nothing else is done, then it can be expected that coaxial cable will not act as an antenna as the shield 53 will shield the core 52 and to a large degree prevent radiation.

However, it has been determined by the present inventors that if gaps (or breaks) are provided in the outer shield 53 at selected locations an effective antenna can be realised. In the present embodiment, two breaks 53a are provided in the outer shield 53 at locations part way along the length of coaxial cable 51. In the present embodiment each break 53a in the shield 53 is provided at a distance of 100 mm from a mid-point of the length of coaxial cable 51. Thus in this embodiment there is a distance of 200 mm between the two breaks 53a in the outer shield 53. The exact length of the breaks 53a is not generally considered particularly important but they may be of the order of say 3 mm. Any outer insulating casing and inner insulating spacer in the coaxial cable 51 may also be absent in the breaks 53a, or say for convenience the outer casing may be absent and the inner spacer present in the breaks 53a. It is the break(s) 53a in the outer conductive shield 53 that is (are) functionally important.

The length of coaxial cable 51 can be considered to comprise two portions, a first portion 51a on a first side of the feed point 52a and a second portion 51b on a second side of the feed point 52a. In this way a first of the breaks 53a is provided in the first coaxial cable portion 51a and a second of the breaks 53a is provided in the second coaxial cable portion 51b. The outer shield 53 in the first coaxial cable portion 51a is electrically connected to the outer shield 53 in the second coaxial cable portion 51b so that there is a central portion of shield 53b which is electrically continuous between the two breaks 53a. This central portion of the shield 53b acts as a radiating element in operation of the antenna. Beyond the central portion 53b are two end portions 53c of the shield 53 which typically carry current but which are typically not usefully radiating elements.

In the present embodiment a first inductor 54a is provided towards a distal end of the first portion of coaxial cable 51a and is electrically connected between the outer shield 53 (specifically the end portion 53c) and inner core 52 at a location towards this distal end. A second inductor 54b is provided towards a distal end of the second coaxial cable portion 51b and is electrically connected between the outer shield 53 (specifically the end portion 53c) and the inner core 52 at a location towards this distal end.

In other embodiments, different forms of antenna may be provided. For example the antenna may be arranged as a monopole antenna with a feed point provided towards one end of a length of coaxial cable, or a multiple antenna can be provided. In any such case the or each length of coaxial cable will be provided with a respective break in the shield.

In operation when an RF driving voltage from the source is applied at the feed point 52a, that is when this voltage source is connected between the core in the first coaxial cable portion 51a and the core in the second coaxial cable portion 51b, current flows in the core 52 and the outer shield 53 as well as through the inductors 54a and 54b. The central portion 53b of the outer shield 53 acts as a radiating element for the transmission of RF signals away from the antenna 5 towards the subject to be scanned.

The characteristics of the coaxial cable itself, the inductors 54a, 54b, the length of the central section 53b and the length of each of the end sections 53c of the outer shield may be selected to give desirable transmission characteristics for the antenna 5.

FIG. 3 shows again, in schematic form, the dipole antenna shown in FIG. 2. Here a feeding cable 6 is shown connected to the inner core 52 via a matching circuit 55.

In the present embodiment with suitable values chosen for the inductors 54a, 54b, the matching circuit may comprise a single capacitor connected in parallel with the feeding cable 6.

In other embodiments, the matching circuit 55 may comprise further or different components. Similarly, as well as or instead of the inductors 54a, 54b provided at the ends of the length of coaxial cable, other components may be provided in these regions. In one alternative, the ends of the coaxial cable 51 may be left open circuit. In other alternative, the ends of the coaxial cable 51 may be short circuited. In further examples, other components such as resistors, capacitors, and so on, may be provided in a connection between the respective ends of the core 52 and the shield 53.

In at least some circumstances, each component provided at the ends of the coaxial cable 51, that is to say the inductors 54a, 54b or different components used in their place, may be selected for tuning the antenna 5 for use with particular driving frequencies. In some circumstances these components may be selected to allow tuning when driven at a selected one of a plurality of different frequencies at different times or to facilitate tuning when driven at a frequency within a predetermined range of frequencies. In some instances, these components may be arranged to include a switching circuit so that the antenna 5 may be switched between a configuration suitable for tuning the antenna 5 for operation at a first predetermined frequency and tuning the antenna 5 for operation at a second driving frequency or arranged to allow switching between more than two different configurations, each arranged to cause the antenna 5 to be tuned for being driven at a respective driving frequency. Similarly, of course, the driving source be this in the main MRI scanner 1 or separately provided, can be arranged to drive at the selected driving frequency or frequencies.

The inductors 54a, 54b as well as the other characteristics of the antenna 5 will give rise to an input impedance. It is particularly convenient if this input impedance is selected so as to allow for use of a single component such as a single capacitor in the matching circuit 55. By appropriately selecting the inductors 54a, 54b, that is to say the inductance value of these inductors, the real part of the input impedance of the antenna 5 may be selected to be at least 10 Ohm and possibly as close as possible to 50 Ohms where the feeding cable is 50 Ohm coaxial cable. Where the real part of the input impedance is say at least 10 Ohm and preferably in the region of 50 Ohms this can correspond to enhanced stability in the antenna and facilitate the use of a single component in the matching circuit 55.

In general the value of the inductance of the inductors 54a, 54b (or the characteristics of other components provided at these end locations) can be used to control the current carrying characteristics of the antenna 5 and hence its radiating properties.

Figure 3:
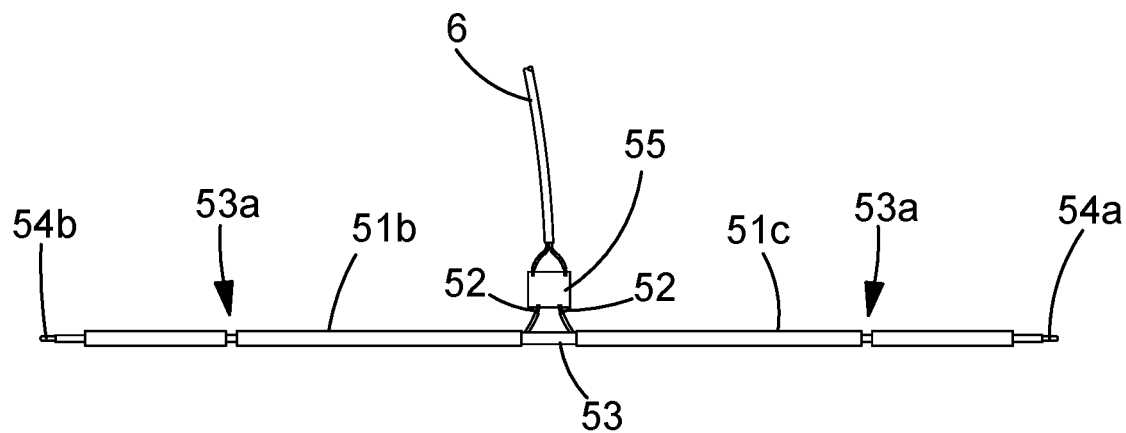
FIG. 3 schematically shows the antenna of FIG. 2 connected to a feeding cable.
Figure 4:
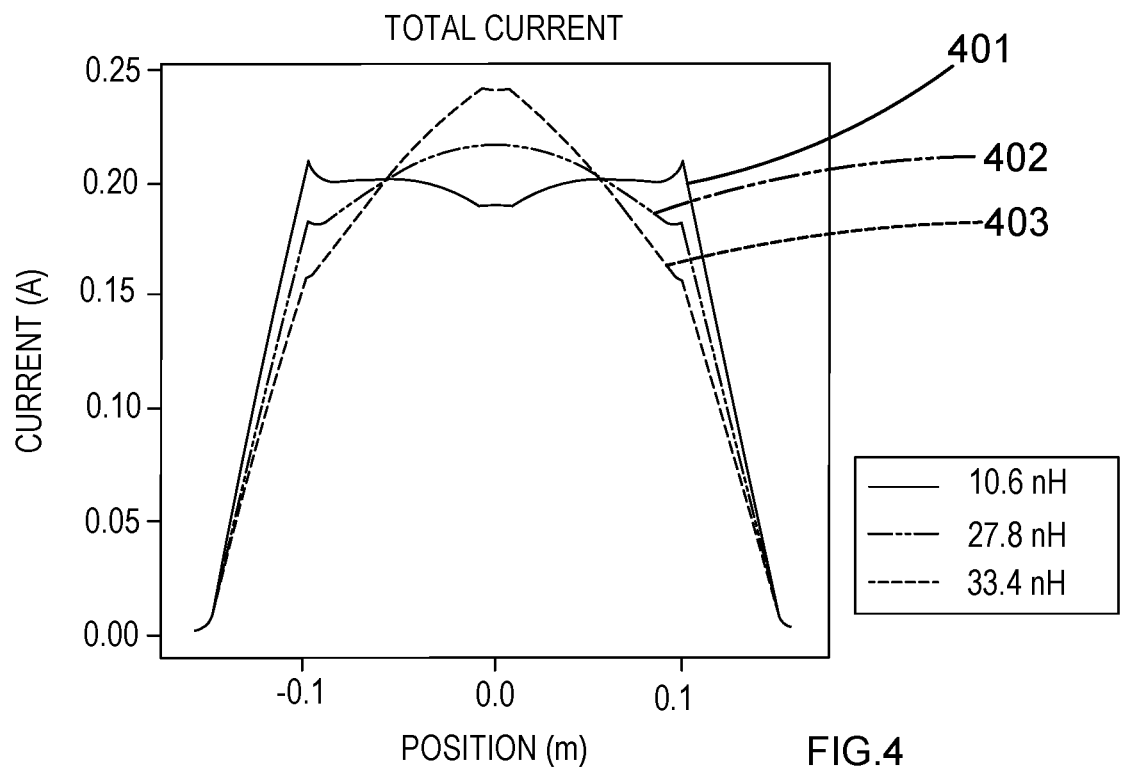
FIG. 4 is a plot showing total current levels flowing in an antenna of the type shown in FIGS. 2 and 3 where inductors included in the antenna have differing values.

FIG. 4 is a plot showing total current along the length of coaxial cable 51 of an antenna 5 of the type shown in FIGS. 2 and 3, that is to say showing the total current flowing in the antenna 5 at different points along its length. There are three traces in the plot, each one corresponding to a different inductance value for the inductors 54a, 54b and showing the respective different current profiles which are produced. A first of the traces 401 shows the current where the inductance value is 10.6 nH. A second of the traces 402 shows the current where the inductance value is 27.8 nH. A third of the traces 403 shows the current where the inductance value is 33.4 nH.

It is preferable to have a relatively flat current profile on the outer shield 53 for promoting good transmission characteristics without loss and for minimising undesirable heating in a subject to be scanned.

Figure 5:
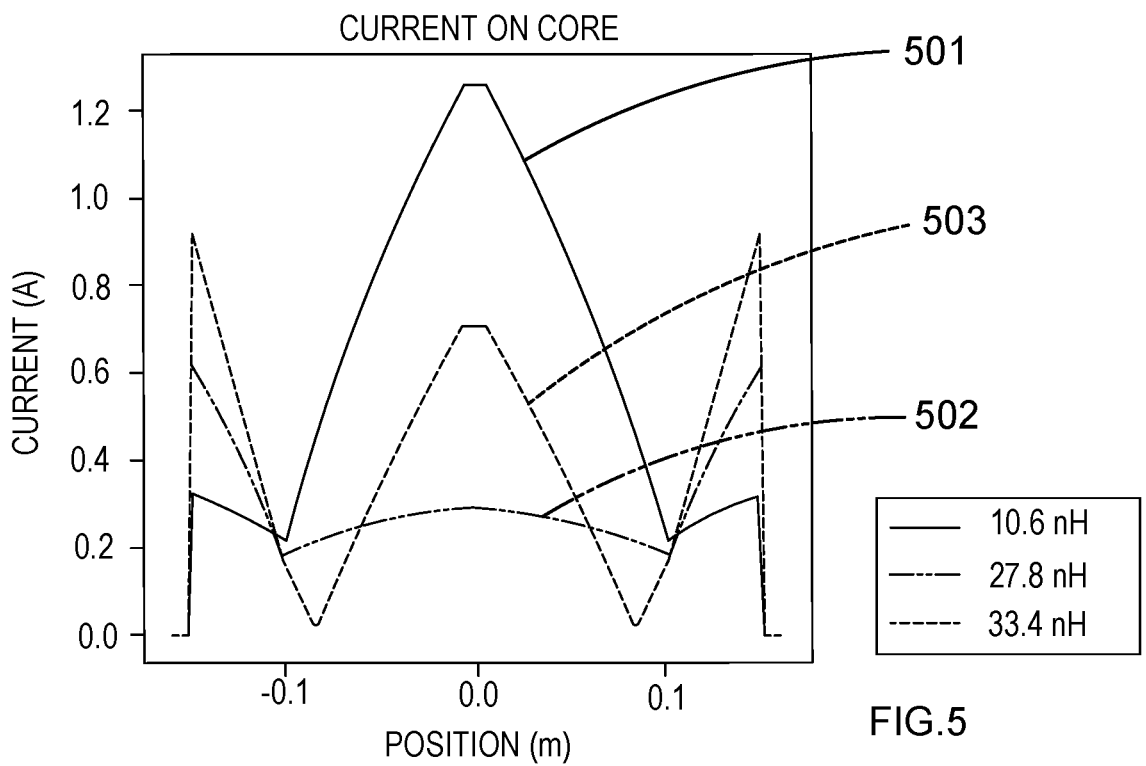
FIG. 5 is a plot showing current on a core of an antenna of the type shown in FIGS. 2 and 3 where inductors included in the antenna have different inductance values.

FIG. 5 is a plot showing current levels by position along the core 52 of the coaxial cable 51 of an antenna 5 of the type shown in FIGS. 2 and 3. Again the plot shows three traces, one each for different inductance values of inductors 54a, 54b. A first of the traces 501 shows the core current where the inductance value is 10.6 nH. A second of the traces 502 shows the core current where the inductance value is 27.8 nH. A third of the traces 503 shows the core current where the inductance value is 33.4 nH. Here it can be seen that at some inductor values a much higher current flows in the core 53 which will correspond to greater losses as it is current in the shield 53 that is driving $B_1$ field generation.

By appropriate modelling, preferable values for inductance of the inductors 54a, 54b can be selected which yield a relatively flat total current whilst also exhibiting minimised current in the core 52 to give good transmission characteristics whilst minimising losses.

In the present example, for an antenna with a total length of 300 mm and breaks 53a in the outer shield 53 provided at 100 mm from the centre, it was found that an inductance value in the order of 28 nH provided a relatively flat current on the outer with reduced core currents. Furthermore, this arrangement yielded an input impedance with a real part in the order of 50 Ohms facilitating the use of a single capacitor of 10 pF in the matching circuit 55.

Generally speaking it has been found that moving the breaks 53a in the outer shield 53 away from the centre of the length of coaxial cable 51 leads to a flatter current distribution. However, without taking some remedial measures, (such as introducing components such as inductors 54a, 54b at the ends of the length of coaxial cable 51) increasing the gap between the breaks 53 in the shield 53 can serve to tend to increase core currents.

In order to determine suitable characteristics for antennas 5 of other sizes, a process along the lines of the below can be followed making use of modelling/simulation software. This process can include the steps of:

1) Determine how long the middle section 53b should be. In general, this depends on the field of view that you would like to image. For a general purpose MRI antenna, 20 cm/200 mm is a good length since it is large enough to cover most organs. We will call this length L.
2) Simulate sections of coaxial cable which are longer than L with a source connected to the core 52 at the centre and two breaks 53a in the outer shield 53 each positioned at a distance of L/2 from the centre, and two inductors, one at each end of the length of coaxial cable 51, connecting the core 52 to the shield 53. We will call the length of the end sections 53c from each break 53a to the respective end of the cable portion X so the total antenna length is L+2X.
3) Find the combination of length X and inductance value for the inductors 54a, 54b, that result in three beneficial properties:
    i. A "flat" current distribution on the outside of the shield 53 between the breaks 53a
    ii. A minimum amount of loss due to unnecessary currents;
    iii. An input impedance at the source which can be easily matched to a feeding cable (say typically a 50 Ohm coaxial cable).

Due consideration can also be given to the frequency or a range of frequencies at which the antenna 5 is to be driven in use in carrying out the above process.

The following can be considered in relation to the desirable metrics:
  i. Flat current distribution.

The flatness of current distribution can be described using the coefficient of variation which the standard deviation divided by the mean value of current amplitude along the length L. The lower this number is the better.

Some example values: For a triangular current distribution, that is 0 at the breaks (which we might consider really bad) this value is 0.58. For a current distribution of a plain dipole with 30 cm length at 300 MHz the CoV over the length L is 0.22. For a conventional fractioned dipole antenna which is 30 cm, the CoV of the middle 20 cm is 0.17. In the case of the coaxial dipole antenna 5 of the type described above where L=20 cm and X=5 cm, the CoV over the middle 20 cm is 0.11 (we can characterise this as a very acceptable value). The best possible value is 0 which is practically unachievable.

If we take a typical length of a radiating element part of an antenna of the present type, say 20 cm, a CoV higher than 0.2 would be considered bad. Anything lower than 0.15 is good and anything lower than 0.10 would be extremely good.

ii. Minimal losses.

Losses can be quantified by the percentage of input power that is wasted. If the currents on the core 52 are high they tend to heat up the copper and this costs power. One could increase the length X so as to be a lot longer than 5 cm. This may serve to reduce the currents in the core 52 but wastes energy in these longer lengths of cable. In tests it was found that an antenna made using a cable of length 300 mm with breaks at 125 mm so giving a field of view of 250 mm and with no inductors connected at the ends of the cable would waste 33% of input power which is highly undesirable. Where gaps are provided at 100 mm and no inductors are provided, 11% of power is wasted whereas the inclusion of the inductors 54a, 54b, brought waste power down to 6.5%. In general terms, losses of above 20% of input power is probably unacceptable whereas losses below 20% and down to the order of 10% is not good, but probably acceptable under some circumstances. Losses below 10% and say approaching 5% are considered good.

iii. Favourable input impedance.

Some trial and error maybe required in perfecting input impedance. The real part of the input impedance is an important factor in attempting to achieve optimal operation and considering a situation where the feeding cable is a 50 Ohm coaxial cable, having the real part of the input impedance in the order of 50 Ohms would be ideal whereas anything above 10 Ohms is probably effective. With an input impedance below 10 Ohms problems are more likely to occur. In at least some circumstances, it is beneficial if only a single component is needed in the matching circuit 55 although overall what it is of most interest is the performance of the antenna 5 and what losses there may be. Thus, if currents in the matching circuit 55 are low, even if there are multiple components in the matching circuit 55, this may not be problematic.

In general terms, it is desirable if the real part of the input impedance is at least 5 Ohms and more preferably at least 10 Ohms. Further it may be preferable if the real part of the input impedance, is close to 50 Ohms or more generally close to the impedance of the feeding cable being used to feed the antenna and it can be desirable if only one matching element is required in the matching circuit 55.

After modelling and selecting appropriate values an antenna can be manufactured—which may include taking one or more length of coaxial cable, creating the appropriate breaks in the shield, creating a feed point, adding connecting components and a matching circuit. If desired testing may be carried out to see the $B_1$ field generated for given input power and also the resulting heating effect in a sample/phantom as a proxy for SAR.

Of course a similar process may also be followed if connecting components other than inductors are selected.

It has been found that antennas 5 of the current kind for example, a dipole antenna of the type shown in FIGS. 2 and 3, can give rise to superior performance in operation to prior art fractionated dipole antennas. An example prior art fractionated antenna can be seen for example in DE202007015620U1.

Figure 6:
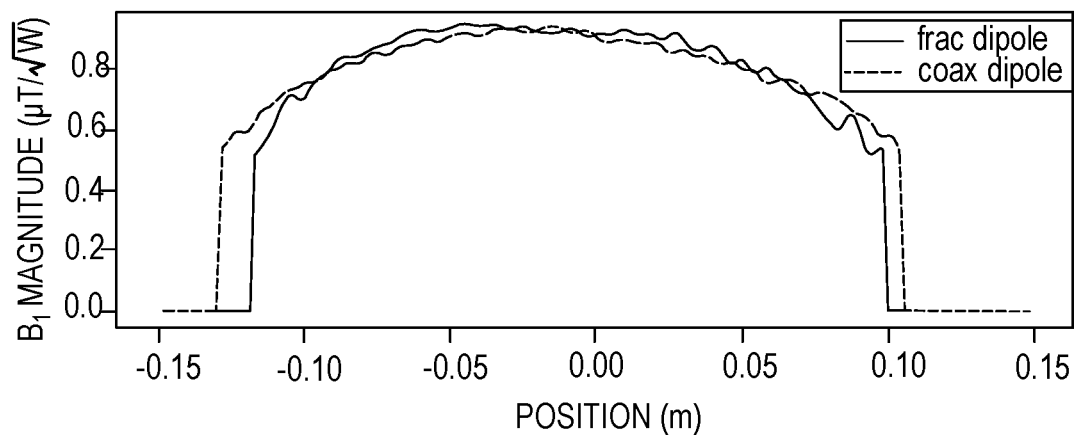
FIG. 6 is a plot showing the $B_1$ magnitude achieved in a sample using an antenna of the type shown in FIGS. 2 and 3 in comparison with a prior art fractionated dipole antenna.
Figure 7:
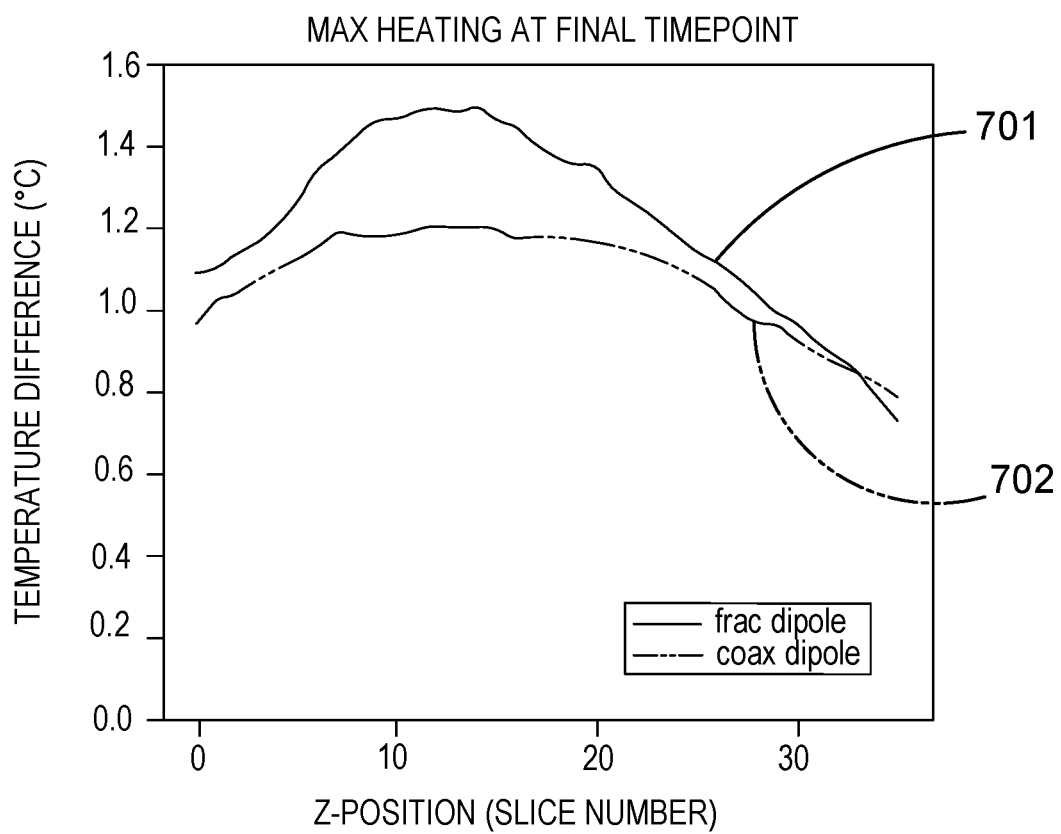
FIG. 7 is a plot showing heating effect by position observed in a sample when a $B_1$ field is applied to that sample using an antenna of the type shown in FIGS. 2 and 3 in comparison to the heating effect seen when using a prior art fractionated dipole antenna.

This improvement in performance is observable in terms of the $B_1$ fields which may be generated and the associated SAR which results from their use. FIG. 6 shows an example of the $B_1$ field which can be generated with a prior art fractioned dipole antenna compared to that generated with a coaxial dipole antenna 5 of the type shown in FIGS. 2 and 3 and it can be seen here that the $B_1$ field generated is similar. However, where the advantage is seen is by considering the plots shown in FIG. 7 which show the heating effect of each type of antenna i.e. showing the effect of the difference in SAR caused by the two antennas 5. A first trace 701 shows the temperature increase caused by the prior art fractionated dipole and a second trace 702 shows the temperature increase caused by use of the coaxial dipole of the type described above. Here it can be seen that the heating effect given by the fractionated dipole over a range of positions in the subject is significantly greater than that created using the coaxial dipole of the type shown in FIGS. 2 and 3.

Further the current type of antenna is simple to construct and is inherently flexible being made of one or more length of coaxial cable and optionally a minimal number of additional electrical components.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An MRI system RF transmit antenna arrangement comprising an antenna comprising a length of coaxial cable with an electrically conductive core and an electrically conductive outer shield through which the core runs, with the core having a feed point arranged for electrical connection to an RF source and at least one break being provided in the electrically conductive outer shield partway along the length of coaxial cable so as to divide the electrically conductive outer shield into at least two axially spaced shield portions such that at least one of the shield portions acts as a radiating element when an RF source is connected to the feed point, wherein the antenna is arranged as a dipole antenna with the feed point provided towards a midpoint of the length of coaxial cable so that the length of coaxial cable has a first coaxial cable portion on one side of the feed point and a second coaxial cable portion on a second, opposite, side of the feed point, and wherein the shield in the first coaxial cable portion is electrically, typically galvanically, connected to the shield in the second coaxial cable portion and the core in the first coaxial cable portion and the core in the second coaxial cable portion are arranged for the source to be connected therebetween at the feed point.

2. The MRI system RF transmit antenna arrangement according to claim 1 in which at least one break is provided in the electrically conductive outer shield partway along the length of the first coaxial cable portion and at least one break is provided in the electrically conductive outer shield partway along the length of the second coaxial cable portion so as to divide the electrically conductive outer shield of the length of coaxial cable into at least three axially spaced shield portions such that at least one of the shield portions acts as a radiating element when an RF source is connected to the feed point.

3. The MRI system RF transmit antenna arrangement according to claim 1 in which the antenna comprises more than two coaxial cable portions leading away from the feed point and there is at least one break provided in the electrically conductive outer shield partway along the length of each coaxial cable portion such that each radiating element of the antenna arrangement is provided by at least one shield portion of a respective coaxial cable portion, where said at least one shield portion is spaced by an axial break in the conductive outer shield of the respective coaxial cable portion from another shield portion of the respective coaxial cable portion.

4. The MRI system RF transmit antenna arrangement according to claim 1 in which the antenna is arranged as a monopole antenna with the feed point provided in the region of one end of the length of coaxial cable.

5. The MRI system RF transmit antenna arrangement according to claim 1 which comprises at least one electrical component connected to at least one of the electrically conductive outer shield and the electrically conductive core of the length of coaxial cable for controlling the electrical characteristics of the antenna arrangement.

6. The MRI system RF transmit antenna arrangement according to claim 5 in which the antenna is arranged as a dipole antenna with the fed point provided towards a midpoint of the length of coaxial cable so that the length of coaxial cable has a first coaxial cable portion on one side of the feed point and a second coaxial cable portion on a second, opposite, side of the feed point and a first inductor is provided towards a distal end of the first portion of coaxial cable and is electrically connected between the outer shield and inner core at a location towards this distal end and a second inductor is provided towards a distal end of the second coaxial cable portion and is electrically connected between the outer shield and the inner core at a location towards this distal end.

7. The MRI system RF transmit antenna arrangement according to claim 1 which comprises at least one connecting electrical component which is electrically connected between the electrically conductive outer shield and the electrically conductive core of the length of coaxial cable towards an end which is away from the feed point.

8. The MRI system RF transmit antenna arrangement according to claim 7 in which the at least one connecting electrical component comprises an inductor.

9. The MRI system RF transmit antenna arrangement according to claim 7 in which the at least one connecting electrical component is selected to tune the antenna arrangement for operation whilst driven at a predetermined RF source frequency.

10. The MRI system RF transmit antenna arrangement according to claim 1 which comprises a matching circuit provided at the feed point via which the electrical source is connectable to the antenna arrangement.

11. The MRI system RF transmit antenna arrangement according to claim 1 in which the at least one length of coaxial cable has a length in the range 10 cm to 100 cm.

12. The MRI system RF transmit antenna arrangement according to claim 1 in which the radiating element has a length in the range 8 cm to 75 cm.

13. The MRI system RF transmit antenna arrangement according to claim 1 in which the ratio of the length of the radiating element to the overall length of the coaxial cable is in the range 0.2:1 to 0.9:1.

14. The MRI system RF transmit antenna arrangement according to claim 1 in which the antenna arrangement is arranged as a body part specific antenna arrangement and comprises a support structure for supporting the at least one length of coaxial cable in a configuration which is selected for scanning the respective body part.

15. The MRI system RF transmit antenna arrangement according to claim 1 which comprises at least one RF receive coil.

16. An MM system comprising an MRI system RF transmit antenna arrangement according to claim 1.

17. An MR-Linac system comprising an MM system according to claim 16 and a medical linear accelerator system.

18. A PET-MR system comprising an MRI system according to claim 16 and a positron emission tomography system.

19. A thermal therapy-MR system comprising an MRI system according to claim 16 and a thermal therapy system.

20. A method of manufacturing an MM system RF transmit antenna arrangement comprising an antenna comprising a length of coaxial cable with an electrically conductive core and an electrically conductive outer shield through which the core runs, with the core having a feed point arranged for electrical connection to an RF source and at least one break being provided in the electrically conductive outer shield partway along the length of coaxial cable so as to divide the electrically conductive outer shield into at least two axially spaced shield portions such that at least one of the shield portions acts as a radiating element when an RF source is connected to the feed point, wherein the antenna is arranged as a dipole antenna with the feed point provided towards a midpoint of the length of coaxial cable so that the length of coaxial cable has a first coaxial cable portion on one side of the feed point and a second coaxial cable portion on a second, opposite, side of the feed point, wherein the first and second coaxial cable portions each are provided with a respective break in the outer shield partway along the length of the respective coaxial cable portion, the method comprising the steps of:
  a) selecting a desired length, L, for the radiating element of the antenna, which corresponds to a distance between the respective breaks in the outer shield;
  b) modelling the antenna including the first and second coaxial cable portions each with a break in the outer shield at distance L/2 from the feed point and end portions of coaxial cable of length X beyond the respective break, a source connected to the feed point, at least one first connecting electrical component provided towards a distal end of a first of the coaxial cable portions and at least one second connecting electrical component provided towards a distal end of a second of the coaxial cable portions;
  c) determining a value for length X and characteristics of the at least one first and second connecting electrical components which optimise:
    i) flatness of current distribution on the radiating element;
    ii) loss minimisation in the inner core and connecting components; and
    iii) a desirable input impedance at the source; and
  d) making the transmit antenna arrangement to said design.

21. The method of manufacturing an MRI system RF transmit antenna arrangement according to claim 20 in which the at least one first connecting electrical component comprises an inductor, the at least one second connecting electrical component comprises an inductor and the step of determining a value for length X and characteristics of the at least one first and second connecting electrical components comprises determining a value for length X and a value of inductance for each inductor.

22. An MRI system RF transmit antenna arrangement comprising an antenna comprising a length of coaxial cable with an electrically conductive core and an electrically conductive outer shield through which the core runs, with the core having a feed point arranged for electrical connection to an RF source and at least one break being provided in the electrically conductive outer shield partway along the length of coaxial cable so as to divide the electrically conductive outer shield into at least two axially spaced shield portions such that at least one of the shield portions acts as a radiating element when an RF source is connected to the feed point, wherein the antenna is arranged as a dipole antenna with the feed point provided towards a midpoint of the length of coaxial cable so that the length of coaxial cable has a first coaxial cable portion on one side of the feed point and a second coaxial cable portion on a second, opposite, side of the feed point, and wherein at least one break is provided in the electrically conductive outer shield partway along the length of the first coaxial cable portion and at least one break is provided in the electrically conductive outer shield partway along the length of the second coaxial cable portion so as to divide the electrically conductive outer shield of the length of coaxial cable into at least three axially spaced shield portions such that at least one of the shield portions acts as a radiating element when an RF source is connected to the feed point.

23. An MRI system RF transmit antenna arrangement comprising an antenna comprising a length of coaxial cable with an electrically conductive core and an electrically conductive outer shield through which the core runs, with the core having a feed point arranged for electrical connection to an RF source and at least one break being provided in the electrically conductive outer shield partway along the length of coaxial cable so as to divide the electrically conductive outer shield into at least two axially spaced shield portions such that at least one of the shield portions acts as a radiating element when an RF source is connected to the feed point, wherein the antenna arrangement comprises at least one electrical component connected to at least one of the electrically conductive outer shield and the electrically conductive core of the length of coaxial cable for controlling the electrical characteristics of the antenna arrangement.

24. The MRI system RF transmit antenna arrangement according to claim 23 in which the at least one electrical component is electrically connected between the electrically conductive outer shield and the electrically conductive core of the length of coaxial cable towards an end which is away from the feed point and the at least one connecting electrical component comprises an inductor.

25. The MRI system RF transmit antenna arrangement according to claim 23 in which the at least one electrical component is electrically connected between the electrically conductive outer shield and the electrically conductive core of the length of coaxial cable towards an end which is away from the feed point and the at least one connecting electrical component is selected to tune the antenna arrangement for operation whilst driven at a predetermined RF source frequency.

26. The MRI system RF transmit antenna arrangement according to claim 23 in which the antenna is arranged as a dipole antenna with the fed point provided towards a midpoint of the length of coaxial cable so that the length of coaxial cable has a first coaxial cable portion on one side of the feed point and a second coaxial cable portion on a second, opposite, side of the feed point and a first inductor is provided towards a distal end of the first portion of coaxial cable and is electrically connected between the outer shield and inner core at a location towards this distal end and a second inductor is provided towards a distal end of the second coaxial cable portion and is electrically connected between the outer shield and the inner core at a location towards this distal end.

27. An MR-Linac system comprising:
an MRI system;
an MRI system RF transmit antenna arrangement comprising an antenna comprising a length of coaxial cable with an electrically conductive core and an electrically conductive outer shield through which the core runs, with the core having a feed point arranged for electrical connection to an RF source and at least one break being provided in the electrically conductive outer shield partway along the length of coaxial cable so as to divide the electrically conductive outer shield into at least two axially spaced shield portions such that at least one of the shield portions acts as a radiating element when an RF source is connected to the feed point; and
a medical linear accelerator system.

28. A PET-MR system comprising:
an MRI system;
an MRI system RF transmit antenna arrangement comprising an antenna comprising a length of coaxial cable with an electrically conductive core and an electrically conductive outer shield through which the core runs, with the core having a feed point arranged for electrical connection to an RF source and at least one break being provided in the electrically conductive outer shield partway along the length of coaxial cable so as to divide the electrically conductive outer shield into at least two axially spaced shield portions such that at least one of the shield portions acts as a radiating element when an RF source is connected to the feed point; and
a positron emission tomography system.

29. A thermal therapy-MR system comprising:
an MRI system;
an MRI system RF transmit antenna arrangement comprising an antenna comprising a length of coaxial cable with an electrically conductive core and an electrically conductive outer shield through which the core runs, with the core having a feed point arranged for electrical connection to an RF source and at least one break being provided in the electrically conductive outer shield partway along the length of coaxial cable so as to divide the electrically conductive outer shield into at least two axially spaced shield portions such that at least one of the shield portions acts as a radiating element when an RF source is connected to the feed point; and
a thermal therapy system.

* * * * *

UNITED STATES PATENT AND TRADEMARK OFFICE
CERTIFICATE OF CORRECTION

PATENT NO. : 11,585,878 B2  
APPLICATION NO. : 17/369610  
DATED : February 21, 2023  
INVENTOR(S) : Carel Costijn Van Leeuwen et al.

Page 1 of 1

It is certified that error appears in the above-identified patent and that said Letters Patent is hereby corrected as shown below:

In the Claims

Claim 16, Line 1, remove "MM system" and insert --MRI system--.

Claim 17, Line 1, remove "MM system" and insert --MRI system--.

Claim 20, Line 1, remove "MM system" and insert --MRI system--.

Signed and Sealed this
Twenty-seventh Day of June, 2023

Katherine Kelly Vidal
*Director of the United States Patent and Trademark Office*